(12) United States Patent
Chang et al.

(10) Patent No.: US 12,399,439 B2
(45) Date of Patent: Aug. 26, 2025

(54) PELLICLE, PELLICLE REMOVAL TOOL, AND METHOD OF UTILIZING PELLICLE AND PELLICLE REMOVAL TOOL

(71) Applicant: Taiwan Semiconductor Manufacturing Co., Ltd., Hsinchu (TW)

(72) Inventors: Hsuan Jung Chang, Hsinchu (TW); Kun-Lung Hsieh, Hsinchu (TW); Ting-Hsien Ko, Hsinchu (TW); Chih-Wei Wen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 223 days.

(21) Appl. No.: 18/319,362

(22) Filed: May 17, 2023

(65) Prior Publication Data
US 2024/0385544 A1 Nov. 21, 2024

(51) Int. Cl.
*G03F 7/20* (2006.01)
*B32B 43/00* (2006.01)
*G03F 7/00* (2006.01)

(52) U.S. Cl.
CPC ........ *G03F 7/70983* (2013.01); *B32B 43/006* (2013.01)

(58) Field of Classification Search
CPC .................. G03F 7/70983; B32B 43/006
See application file for complete search history.

(56) References Cited

U.S. PATENT DOCUMENTS

| | | | |
|---|---|---|---|
| 5,953,107 A * | 9/1999 | Li | G03F 1/64 355/77 |
| 2005/0088637 A1* | 4/2005 | Laganza | G03F 7/70983 430/5 |
| 2011/0215602 A1* | 9/2011 | Shirasaki | B25B 9/02 294/119.1 |
| 2022/0026797 A1 | 1/2022 | Yoo et al. | |
| 2022/0334465 A1 | 10/2022 | Huang et al. | |
| 2022/0334494 A1 | 10/2022 | Zhao | |

FOREIGN PATENT DOCUMENTS

| | | |
|---|---|---|
| CN | 106687860 A | 5/2017 |
| TW | 201339740 A | 10/2013 |
| TW | 201837600 A | 10/2018 |

\* cited by examiner

*Primary Examiner* — Mesfin T Asfaw
(74) *Attorney, Agent, or Firm* — Seed IP Law Group LLP

(57) ABSTRACT

A dis-pellicle tool or pellicle removal tool that includes one or more clamp structures that each include a respective group of pins. The respective pins of the groups of pins of the one or more clamp structures are configured to, in operation, be inserted into holes that are present within a pellicle frame of a pellicle. Once the respective pins of the groups of pins are inserted into the holes of the pellicle frame, a removal force may be applied to the pellicle frame to remove the pellicle from a photomask to which the pellicle is coupled to by an adhesive, glue, or some other similar type of coupling material.

20 Claims, 11 Drawing Sheets

PELLICLE, PELLICLE REMOVAL TOOL, AND METHOD OF UTILIZING PELLICLE AND PELLICLE REMOVAL TOOL

BACKGROUND

In the manufacturing of integrated circuit devices, photomasks, alternatively referred to as photoreticles or reticles, are used to project patterns for the integrated circuits on a semiconductor wafer. To protect the photomask from contamination, which can cause errors in the projected patterns, the photomask has been provided with a pellicle comprised of a pellicle frame and an optically transparent membrane. An adhesive is used to bond the pellicle frame to a surface of the photomask, and the membrane extends across the pellicle frame.

Reasons for removing the pellicle include repairing a defect detected in the photomask, removing haze contamination that has formed on the photomask under the pellicle, and replacing the pellicle due to mechanical damage or exposure damage. Haze contamination is a precipitant formed from chemical residue from the photomask cleaning, impurity of fab or environmental exposure. Currently, precipitated defects or contamination may be caused by airborne contamination from the environment, pellicle adhesive, photomask pod out-gassing, pellicle frame residue, chemical growth and deposition from the reactions, and mixing of chemical solutions.

When the pellicle is removed, damage may occur to the membrane due to forces applied to a pellicle frame of the pellicle being applied in an unbalanced fashion resulting in flexure and bending in the membrane, which may damage the membrane. For example, this damage to the membrane may include cracking, wrinkling, or rupturing that propagates and occurs through and within the membrane such that the membrane is no longer suitable to be utilized to protect a respective photomask or allow light of selected wavelengths to pass through it unimpeded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
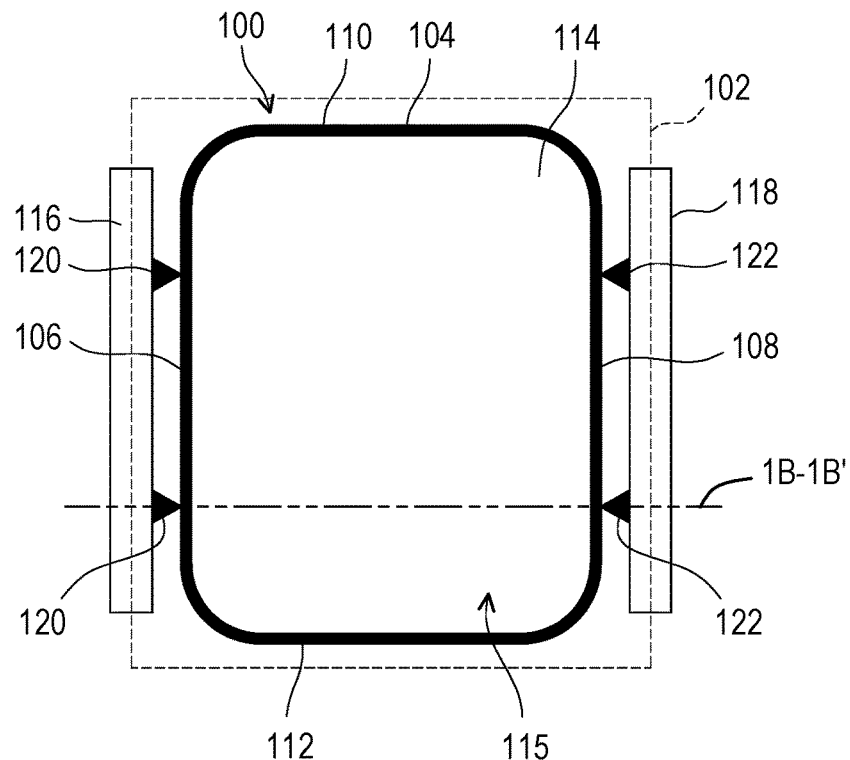
FIG. 1A is a top plan view of a pellicle coupled to a photomask and one or more clamps of a dis-pellicle tool.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, semiconductor wafers, substrates or layers are patterned during a manufacturing process utilizing an extreme ultra-violet (EUV) patterning tool or device. For example, a photomask, which is coupled to a pellicle such that the photomask is overlapped by the pellicle, is aligned with a semiconductor wafer within the EUV patterning tool. EUV light is then emitted by an EUV light source within the EUV patterning tool at the semiconductor wafer to pattern the semiconductor wafer.

After this EUV patterning process is carried out one or more times, the pellicle may be removed from the photomask by a dis-pellicle or pellicle removal tool by utilizing one or more clamp structures of the dis-pellicle or pellicle removal tool. For example, the one or more clamp structures may be engaged with a pellicle frame of the pellicle and the one or more clamp structures may then be moved away from the photomask. As the one or more clamp structures apply the force to the pellicle, an adhesion force of an adhesive coupling the pellicle frame to the photomask is overcome resulting in the pellicle frame of the pellicle breaking away from the adhesive. However, when the force is applied in an unbalanced fashion such that the force is unevenly distributed across the pellicle frame, a membrane of the pellicle coupled to the pellicle frame may be damaged. For example, damage to the membrane may include wrinkling, rupturing, cracking, or some other similar type of damage that may occur in the membrane when the force is unevenly distributed across the membrane. When the membrane is damaged, which is configured to, in operation, protect the photomask from contamination when being utilized within the EUV patterning tool, the pellicle is disposed of resulting in increased manufacturing costs and waste costs as pellicles are relatively expensive.

When this damage occurs in the membrane of the pellicle when removing the pellicle from the photomask, small particles of the membrane may break away from the membrane resulting in the photomask being damaged or contaminated. When the photomask is damaged or contaminated, the photomask is disposed of resulting in increased manufacturing and waste costs as photomasks are relatively expensive.

The present disclosure is directed to providing one or more embodiments of a dis-pellicle tool or pellicle removal tool including one or more clamp structures that are utilized to apply a removal force to a pellicle frame of a pellicle in order to remove the pellicle from a photomask. When the force is applied by the one or more clamp structures to the pellicle frame, the force is applied in a balanced manner across the pellicle frame such that the force is evenly distributed across and along the pellicle frame. This even distribution of the removal force prevents or reduces the likelihood of damage to the pellicle or the membrane of the pellicle when being removed from a photomask. For example, this even distribution of the removal force to the pellicle frame may prevent or reduce the likelihood of wrinkling, rupturing, cracking, or other similar defects within a membrane of the pellicle reducing manufacturing costs, reducing waste costs, and preventing or reducing contamination or damage to the photomask to which the pellicle was previously coupled.

Figure 1B:
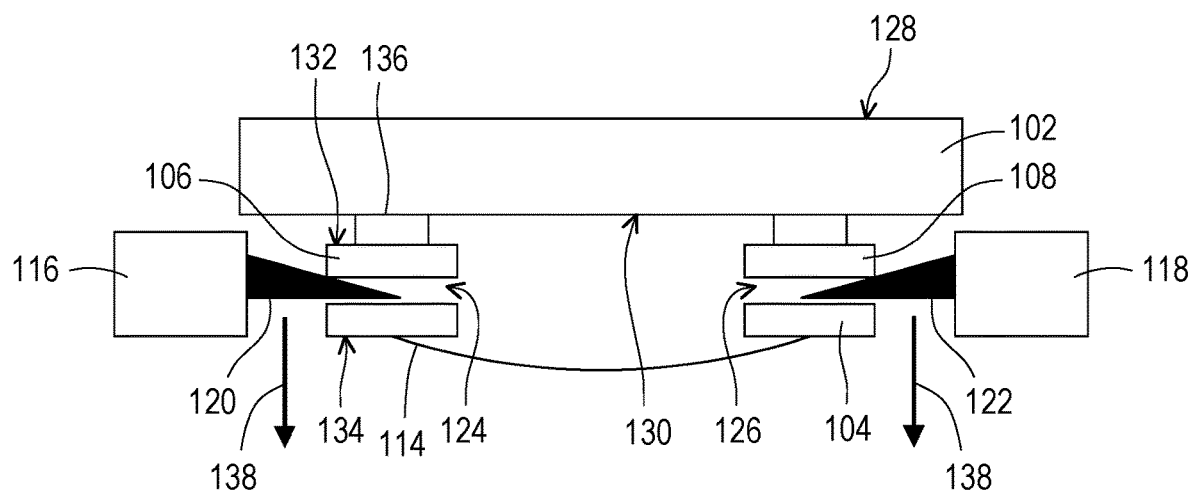
FIG. 1B is a cross-sectional view taken along line 1B-1B' as shown in FIG. 1A of the pellicle coupled to the photomask and the one or more clamps of the dis-pellicle tool as shown in FIG. 1A.

FIG. 1A is a top plan view of a pellicle 100 overlapping a photomask 102 (see FIG. 1B). The pellicle 100 includes a pellicle frame 104 that is coupled to the photomask 102. The pellicle frame 104 includes a first side portion 106, a second side portion 108 opposite to the first side portion 106, a third side portion 110 transverse to the first and second side portions 106, 108 and extends from the first side portion 106 to the second side portion 108, and a fourth side portion 112 transverse to the first and second side portions 106, 108, opposite to the third side portion 110, and extends from the first side portion 106 to the second side portion 108. Respective corners of the frame 110 between the first, second, third, and fourth side portions 106, 108, 110, 112 are rounded corners.

The pellicle 100 further includes a membrane 114 that extends across an opening 115 of the pellicle frame 104 defined by the first, second, third, and fourth side portions 106, 108, 110, 112, respectively. The membrane 114 is configured to, in operation, overlap and cover the photomask 102 such that the membrane 114 acts as a protective cover or boundary preventing or blocking contaminants from reaching the photomask 102. The membrane 114 may be made of a material that allows selected wavelengths of light to pass through the membrane 114 and reach a target aligned with the membrane 114 and the photomask 102. For example, the membrane 114 may be made of a material that allows for EUV light to readily pass through the membrane 114 such that the target (e.g., a semiconductor wafer, semiconductor substrate, semiconductor layer, or some other similar semiconductor structure) is utilizing the membrane 114 and the photomask 102. Alternatively, the membrane 114 may be made of a material that allows for some other wavelength of light to pass through the membrane 114 that may be utilized to carry out various types of patterning techniques.

A dis-pellicle tool or pellicle removal tool includes a first clamp structure 116 and a second clamp structure 118 opposite to the first clamp structure 116. The first clamp structure 116 includes a first group of pins 120, and the second clamp structure 118 includes a second group of pins 122. The first group of pins 120 includes two pins 120, and the second group of pins 122 includes two pins 122.

FIG. 1B is a cross-sectional view of the pellicle 100, the first clamp structure 116, and the second clamp structure 118 taken along line 1B-1B' as shown in FIG. 1A. As shown in FIG. 1B, the first group of pins 120 are inserted into first reception openings 124 that extend through the first side portion 106 of the pellicle frame 104, and the second group of pins 122 are inserted into second reception openings 126 that extend through the second side portion 108. At least one of the first openings 124 and at least one of the second openings 126 is shown in the cross-sectional view illustrated in FIG. 1B. The at least one first opening 124 as shown in FIG. 1B receives a corresponding pin of the first group of pins 120 and the at least one second opening 126 as shown in FIG. 1B receives a corresponding pin of the second group of pins 122. In other words, there is a one-to-one relationship between the first group of pins 120 and the first openings 124 such that each respective pin 120 of the first group of pins 120 is inserted into a corresponding first opening of the first openings 124, and there is a one-to-one relationship between the second group of pins 122 and the second openings 126 such that each respective pin 122 of the second group of pins 122 is inserted into a corresponding second opening of the second openings 126.

The photomask 102 includes a first side 128 and a second side 130 opposite to the first side 128. The first side 128 faces away from the pellicle 100, and the second side 130 faces towards the pellicle 100.

The frame 104 of the pellicle 100 includes a third side 132 and a fourth side 134 opposite to the third side 132. The third side 132 faces towards the second side 130 of the photomask 102, and the fourth side 134 faces away from the photomask 102. The membrane 114 is coupled to the fourth side 134 of the frame 104 of the pellicle 100.

An adhesive 136 is on the second side 130 of the photomask 102 and is on the third side 132 of the frame 104. The adhesive 136 couples or adheres the third side 132 of the frame 104 of the pellicle 100 to the second side 130 of the photomask 102. The adhesive 136 may a glue or some other type of adhesive material.

In operation, when the first group of pins 120 are within the first openings 124 and the second group of pins 122 are in the second opening 126, a force 138 is applied to the pellicle frame 104 that is directed away from the photomask 102. The force 138 may be referred to as a removal force. Based on the orientation as shown in FIG. 1B, the force 138 is directed in a downward direction. The removal force 138 is strong enough to overcome an adhesion force or strength of which the adhesive 136 adheres or couples together the frame 104 to the photomask. For example, when the removal force 138 is applied to the frame 104, the adhesive 136 is broken resulting in the removal of the frame 104 from the photomask 102.

As there are two respective pins 120 in the first group of pins 120 and in the second group of pins 122, the removal force 138 applied to the frame 104 of the pellicle 100 may be much greater in close proximity to the respective pins of the first group of pins 120 and the second group of pins 122 along the first and second clamp structures 116, 118, respectively. In other words, the removal force 138 applied by the first and second clamp structures 116, 118 at the first and second side portions 106, 108 may result in stresses and strains in the frame 104 and in the membrane 114 near or adjacent to the first and second side portions 106, 108 being much greater than those stresses and strains at the third and fourth side portions 110, 112. This uneven distribution of the removal force 138 across the frame 104 results in this uneven distribution of stresses and strains in the membrane 114 and may result in flexure, bending, and warpage of the membrane 114, which may readily be seen in FIG. 1B. This flexure, bending, and warpage of the membrane 114 may result in propagation of damage or defects within the membrane 114, which may readily be seen in FIG. 2.

Figure 2:
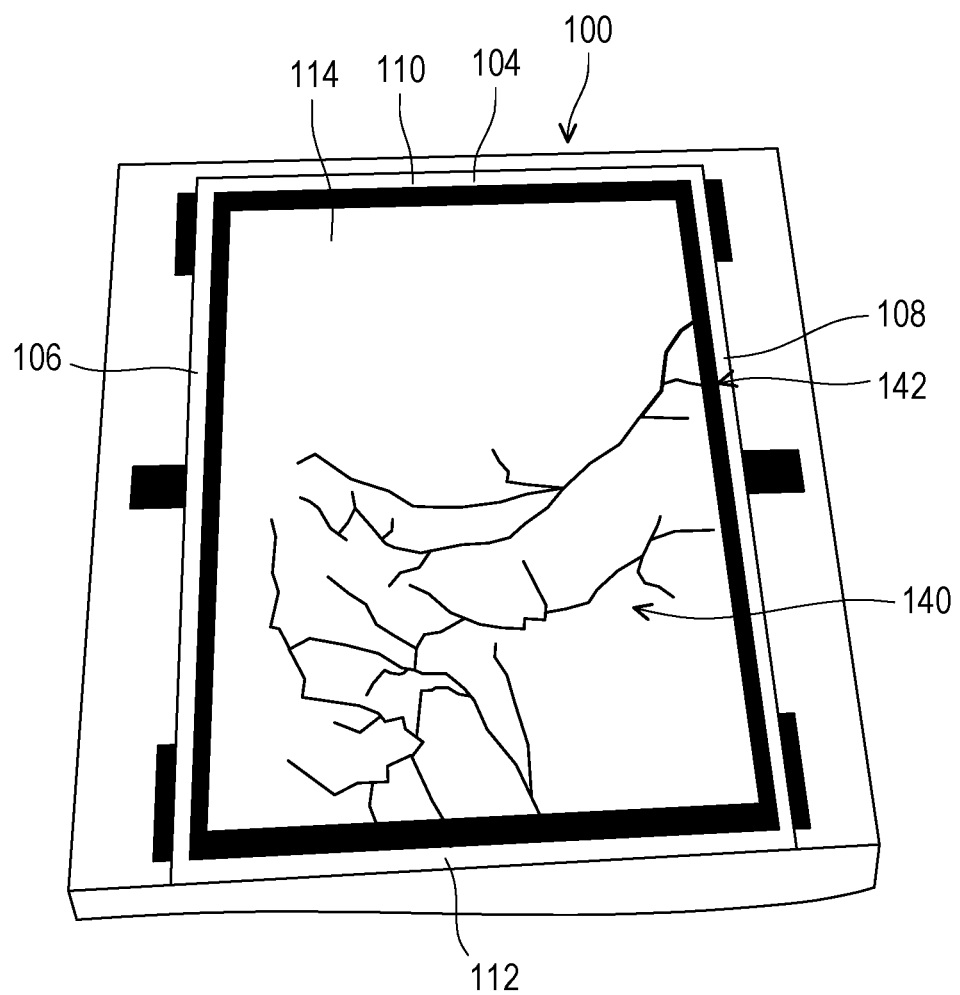
FIG. 2 is a top plan view of a respective pellicle after removal from a respective photomask that resulted in damage and defects to propagate through and within a membrane of the pellicle.

FIG. 2 is a top plan view a respective pellicle that is the same as the pellicle 100 after being removed from a respective photomask that is the same as the photomask 102. As shown in FIG. 2, the membrane 114 of the pellicle has been damaged by removing the pellicle 100 from the photomask 102 utilizing the first and second clamp structures 116, 118. As shown in FIG. 2, a damaged region 140 extending across the membrane 114 is present along locations 142 of the second side portion 108 of the frame 104 of the pellicle 100. These locations 142 may correspond to, be in close proximity to, or near respective locations at which the removal force 138 was applied to the second side portion 108 to remove the pellicle 100 from the photomask 102. In other words, these locations 142 may correspond to, be in close proximity to, or near respective locations of the second openings 126 along the second side portion 108 of the frame 104 of the pellicle 100. While the damaged region 140 propagated at the second side portion 108 of the frame 104 due to bending, flexure, or warpage within the membrane 114, damage may occur at other regions or locations along the membrane 114 when the removal force 138 is applied to the frame 104 of the pellicle 100 when removing the pellicle 100 from the photomask 102 by overcoming the adhesion force or strength of the adhesive 136.

Figure 3A:
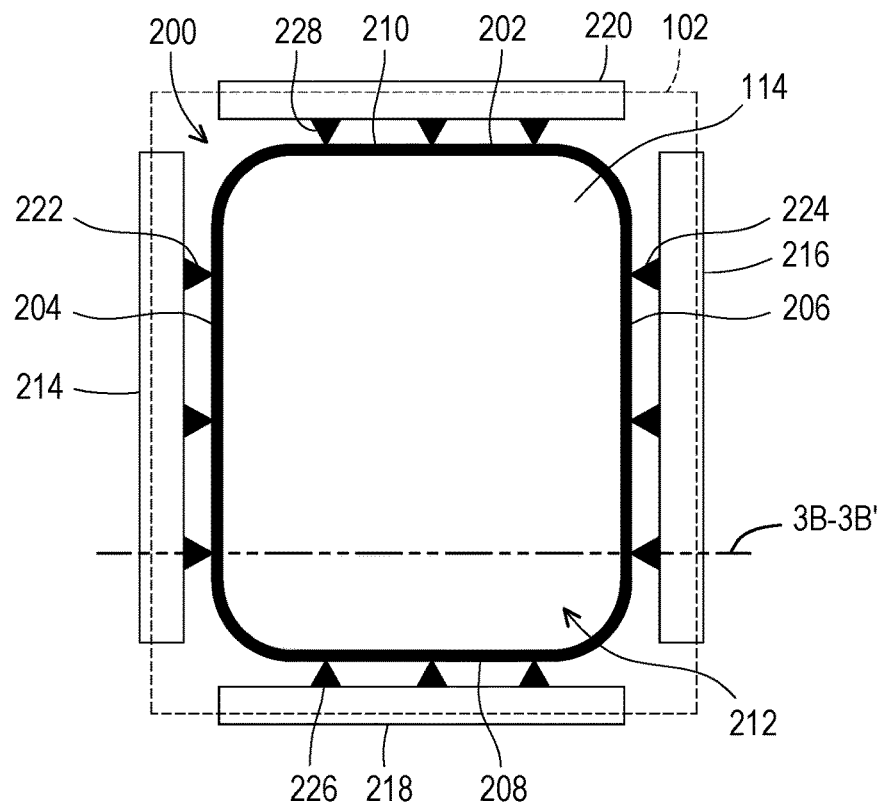
FIG. 3A is a top plan view of a pellicle coupled to a photomask and one or more clamps of a dis-pellicle tool, in accordance with some embodiments.

FIG. 3A is a top plan view of a pellicle 200 coupled to the photomask 102. The pellicle 100 further includes a pellicle frame 202. The pellicle frame 202 may be made of a metal material. The frame includes a first side portion 204, a second side portion 206 opposite to the first side portion 204, a third side portion 208 transverse to the first and second side portions 204, 206 and extends from the first side portion 204 to the second side portion 206, and a fourth side portion 210 opposite to the third side portion 208, transverse to the first and second side portions 204, 206, and extends from the first side portion 204 to the second side portion 206. Respective corners of the frame 202 between the first, second, third, and fourth side portions 204, 206, 208, 210 are rounded corners. The pellicle 200 further includes the membrane 114 that extends across and overlaps an opening 212 of the frame 202 defined by the first, second, third, and fourth side portions 204, 206, 208, 210 of the frame 202.

A dis-pellicle tool or pellicle removal tool includes a first clamp structure 214, a second clamp structure 216 opposite to the first clamp structure 214, a third clamp structure 218 transverse to the first and second clamp structures 214, 216, and a fourth clamp structure 220 transverse to the first and second clamp structures 214, 216 and opposite to the third clamp structure 218. The first clamp structure 214 includes a first group of pins 222, the second clamp structure 216 includes a second group of pins 224, the third clamp structure 218 includes a third group of pins 226, and the fourth clamp structure 220 includes a fourth group of pins 228. In the embodiment of the dis-pellicle tool and the pellicle removal tool as shown in FIG. 3A, each of the first, second, third, and fourth group of pins 222, 224, 226, 228 includes three pins. In some embodiments, the first, second, third, and fourth group of pins 222, 224, 226, 228 may have different numbers of respective pins relative to each other. For example, the first and second groups of pins 222, 224 may include three pins whereas the third and fourth groups of pins 226, 228 may include four pins. In other words, there may be various combinations of numbers of the first group of pins 222, the second group of pins 224, the third group of pins 226, and the fourth group of pins 228.

Figure 3B:
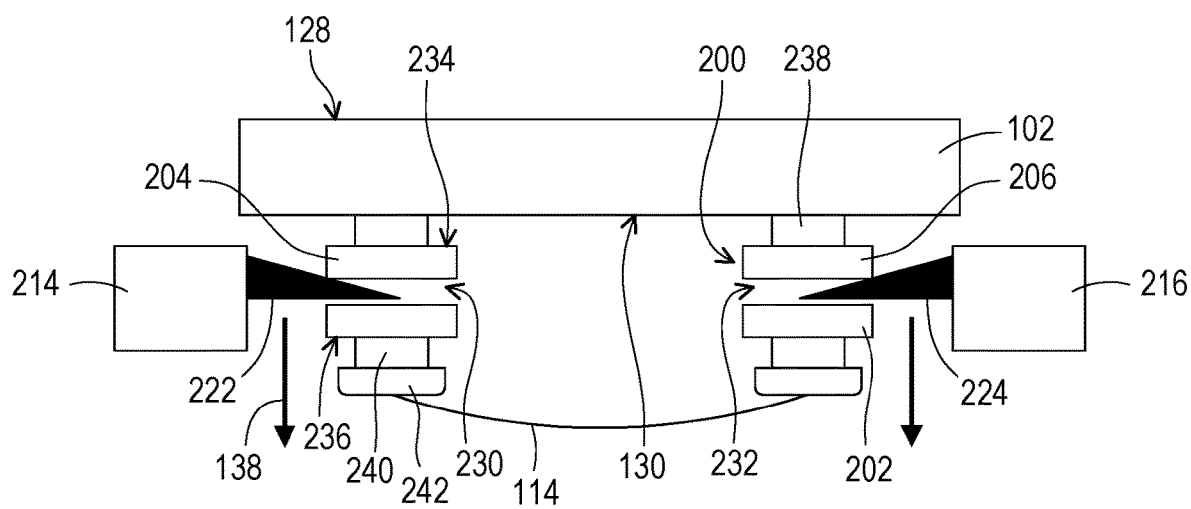
FIG. 3B is a cross-sectional view taken along line 3B-3B' as shown in FIG. 3A of the pellicle coupled to the photomask and the one or more clamps of the dis-pellicle tool as shown in FIG. 3B, in accordance with some embodiments.

FIG. 3B is a cross-sectional view of the pellicle 200, the first clamp structure 214, and the second clamp structure 216 taken along line 3B-3B' as shown in FIG. 3A. As shown in FIG. 3B, the first group of pins 222 are inserted into first reception openings 230 that extend through the first side portion 204 of the frame 202, and the second group of pins 224 are inserted into second reception openings 232 that extend through the second side portion 206 of the frame 202. At least one of the first openings 230 and at least one of the second openings 232 is shown in the cross-sectional view illustrated in FIG. 3B. The at least one first opening 230 as shown in FIG. 3B receives a corresponding pin of the first group of pins 222, and the at least one second opening 232 as shown in FIG. 3B receives a corresponding pin of the second group of pins 224. In other words, there is a one-to-one relationship between the first group of pins 222 and the first openings 230 such that each respective pin 222 of the first group of pins 222 is inserted into a corresponding first opening 230 of the first openings 230, and there is a one-to-one relationship between the second group of pins 224 and the second openings 232 such that each respective pin 224 of the second group of pins 224 is inserted into a corresponding second opening 232 of the second openings 232.

While not shown, the third side portion 208 of the frame 202 includes third reception openings and the fourth side portion 210 includes fourth reception openings. The third and fourth reception openings are the same or similar to the first and second reception openings. The third reception openings of the third side portion 208 receive the third group of pins 226 of the third clamp structure 218, and the fourth reception openings of the fourth side portion 210 receive the fourth group of pins 228 of the fourth clamp structure 220. There may be a one-to-one relationship between the third openings and the third group of pins 226 such that each respective pin 226 of the third group of pins 226 is inserted into a corresponding opening of the third openings, and there may be a one-to-one relationship between the fourth openings and the fourth group of pins 228 such that each respective pin 228 of the fourth group of pins 228 is inserted into a corresponding opening of the fourth openings.

The frame 202 of pellicle 200 includes a third side 234 and a fourth side 236 opposite to the third side 234. The third side 234 faces towards the second side 130 of the photomask 102, and the fourth side 236 faces away from the photomask 102.

A first adhesive 238 is on the second side 130 of the photomask 102 and is on the third side 234 of the frame 202 of the pellicle 200. The first adhesive 238 couples third side 234 of the frame 202 of the pellicle 200 to the second side 130 of the photomask 102. The first adhesive may be a glue or some other type of adhesive.

A second adhesive 240 is on the fourth side 236 of the frame 202 of the pellicle 200 and couples a membrane support frame 242 to the fourth side 236 of the frame 202 of the pellicle 200. The second adhesive 240 may be a glue or some other type of adhesive. The membrane 114 is coupled to the membrane support frame 242.

The membrane support frame 242 may be made of a silicon material. In some embodiments, the membrane support frame 242 may be integral with the membrane 114 such that the membrane support frame 242 and the membrane 114 are made a continuous material, for example, silicon.

In operation, when the first, second, third, and fourth group of pins 222, 224, 226, 228, respectively, are inserted into the first reception openings 230 of the first side portion 204, the second reception openings 232 of the second side portion 206, the third reception openings (not shown) of the third side portion 208, and the fourth reception openings (not shown) in the fourth side portion 210, respectively, the force 138 is applied to the pellicle frame 202 that is directed away from the photomask 102. Based on the orientation as shown in FIG. 3B, the force 138 is directed in the downward direction. The removal force 138 is strong enough to overcome an adhesion force or strength of which the first adhesive 238 adheres or couples together the third side 234 of the frame 202 to the second side 130 of the photomask 102. For example, when the removal force 138 is applied to the frame 202, the first adhesive 238 is broken resulting in the removal of the frame 202 from the photomask 102.

As there are more of the respective pins 222, 224, 226, 228 of the first, second, third, and fourth groups of pins 222, 224, 226, 228 relative to the respective pins 120, the force 138 is more evenly distributed across the frame 202 when removing the frame 202 from the photomask 102 relative to when the first and second groups of pins 120, 122 are utilized to remove the frame 104 from the photomask 102 as discussed earlier herein. The force 138 being more evenly distributed across the frame 202 further prevents or reduces the likelihood of the damage as shown in FIG. 2 from occurring such that manufacturing costs and waste costs are reduced.

As there are more of the respective clamp structures 214, 216, 218, 220 as shown in FIG. 3B relative to the respective clamp structures 116, 118 as shown in FIG. 2, the force 138 is more evenly distributed across the frame 202 when removing the frame 202 from the photomask 102 with the respective clamp structures 214, 216, 218, 220 relative to when the respective clamp structures 116, 118 are utilized to remove the frame 104 from the photomask 102. The force 138 being more evenly distributed across the frame 202 further prevents or reduces the likelihood of damage as shown in FIG. 2 from occurring such that manufacturing costs and waste costs are reduced.

As the second adhesive 240 is present and couples the membrane support frame 242 to the fourth side 236 of the frame 202 of the pellicle 200, the second adhesive prevents or reduces the likelihood of the membrane 114 being exposed to stresses and strains that occur when applying the removal force 138 to the frame 202 utilizing the respective groups of pins 222, 224, 226, 228 and the respective clamp structures 214, 216, 218, 220. In other words, the second adhesive 240 may be configured to, in operation, act as a stress and strain isolated such that stress and strain that occurs in the frame 202 is isolated from membrane 114 preventing or reducing the likelihood of the damage as shown in FIG. 2 from occurring within the membrane 114. The second adhesive 240 may have a relatively high elastic modulus for an adhesive material to further isolate the membrane 114 from the any stress or stain that may occur within the frame 202 when applying the force 138 to the frame 202 to remove the frame 202 from the photomask 102.

As shown in FIG. 3B, there is less bending, flexure, and warping within the membrane 114 relative to the bending, flexure, and warping of the membrane 114 as shown in FIG. 1B. The lesser bending, flexure, and warping within the membrane as shown in FIG. 3B further prevents or reduces the likelihood of damage or defects propagating within the membrane 114.

Figure 3C:
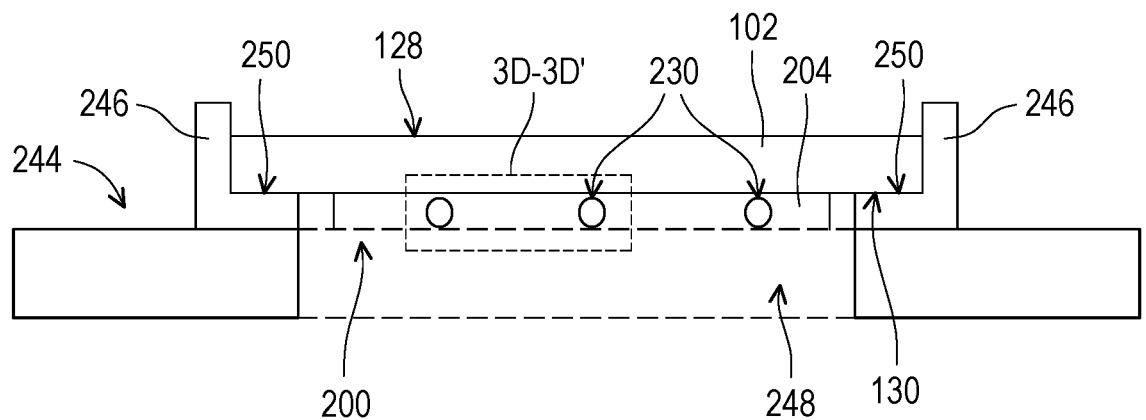
FIG. 3C is a side view of the pellicle coupled to the photomask and one or more clamps of the dis-pellicle tool as shown in FIGS. 3A and 3B, in accordance with some embodiments.

FIG. 3C is a side view of the pellicle 200 coupled to the photomask 102 and the photomask 102 coupled to a photomask stage 244, which includes one or more photomask alignment structures 246 such that the photomask 102 is properly positioned. The photomask stage 244 includes a stage plate 246 that includes clamp structure openings 248 that are configured to allow the first, second, third, and fourth clamp structures 214, 216, 218, 220, respectively, to pass through a corresponding clamp structure opening 248 such that the first, second, third, and fourth group of pins 222, 224, 226, 228, respectively, may be inserted into the first reception openings 230 in the first side portion 204, the second reception openings 232 in the second side portion 206, the third reception openings (not shown) in the third side portion 208, and the fourth reception openings (not shown) in the fourth side portion 210, respectively.

The photomask 102 may be coupled to the photomask alignment structure 246 by an adhesive (not shown). The photomask alignment structure 246 has one or more surfaces 250 that may be adjacent to or may abut the second side 130 of the photomask 102. When the first, second, third, and fourth groups of pins 222, 224, 226, 228, respectively, are inserted into the first reception openings 230 in the first clamp structure 214, the second reception openings 232 in the second clamp structure 216, the third reception openings (not shown) in the third clamp structure 218, and the fourth reception openings (not shown) in the fourth clamp structure 220 and the force 138 is applied to the frame 202, the one or more surfaces 250 may hold the photomask 102 in a stationary position such that the first adhesive 238 breaks resulting in the pellicle 200 being removed from the second side 130 of the photomask 102.

Figure 3D:
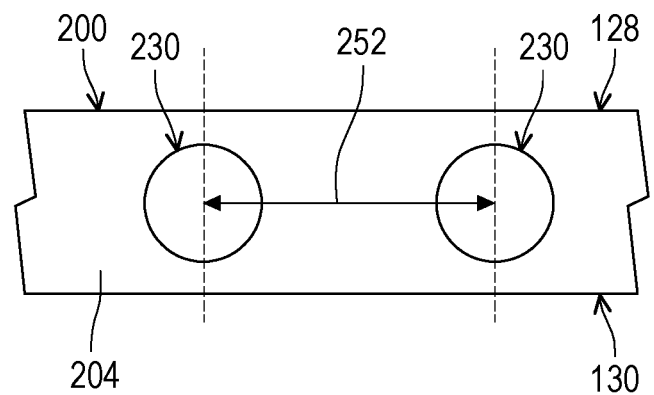
FIG. 3D is a zoomed in and enhanced view of section 3D-3D' of the pellicle as shown in FIG. 3C, in accordance with some embodiments.

FIG. 3D is a zoomed in and enhanced view of section 3D-3D' as shown in FIG. 3C of the first side portion 204 of the frame 202 of the pellicle 200 as shown in FIG. 3C. As shown in FIG. 3C, adjacent first reception openings 230 are spaced apart by a distance 252, which extends between center points of the adjacent first reception openings 230. In at least some embodiments, the distance 252 is determined utilizing the following formulas:

$$\left.\begin{array}{l}\sigma f = \dfrac{M_z}{W_y} = \dfrac{3FL}{2bd^3} \\ F = F_\mu = P_\mu \times \mu\end{array}\right\} \rightarrow L = 6.498\sqrt{\dfrac{1}{\mu}}$$

Figure 4A:
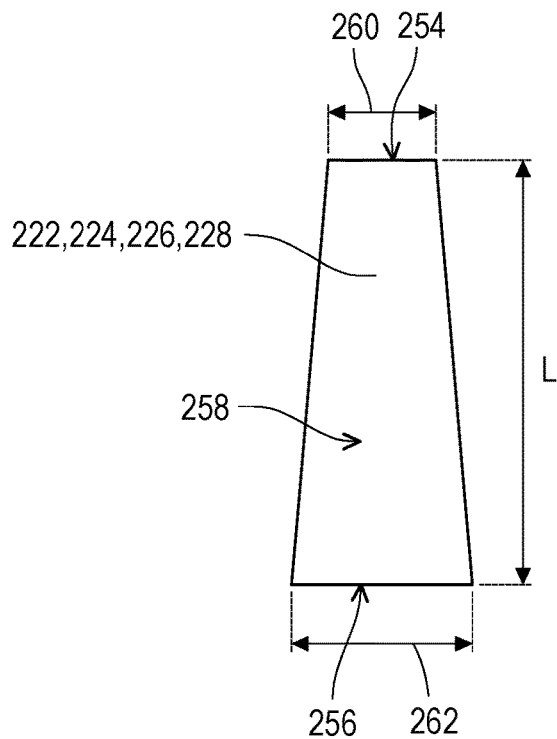
FIG. 4A is a top plan view of a profile of a pin along one or more clamps of a dis-pellicle tool, in accordance with some embodiments.

$\sigma_f$—Silicon bending stress
$M_z$=Moment relative to Neutral Axis z
$W_y$=Resistance Moment relative to Neutral Axis
F=Pellicle bending force with jig pin
L=Distance between jig pin
b=Sample (pellicle) width
h=Sample (pellicle) height
$P_\mu$=Sample (pellicle) quality
μ=Sample (pellicle glue) adhesion FIG. 4A is a top plan view of an embodiment of at least one of the respective pins 222, 224, 226, 228. As shown in FIG. 4A, the respective pin 222, 224, 226, 228 includes a first end 254 and a second end 256 opposite to the first end 254. The first end 254 is an end that is initially inserted into a respective reception opening of the respective reception openings of the first, second, third, and fourth clamp structures 214, 216, 218, 220, respectively. The second end 256 is an end that is coupled to the frame 202 of the pellicle 200 such that the respective pin 222, 224, 226, 228 extends and protrudes from at least one of the first, second, third, and fourth side portions 204, 206, 208, 210, respectively, of the frame 202. The first end 254 has a first area, and the second end 256 has a second area that is less than the first area of the first end 254. The respective pin 222, 224, 226, 228 includes at least one inclined surface 258 that extends from the first end 254 to the second end 256.

Figure 4B:
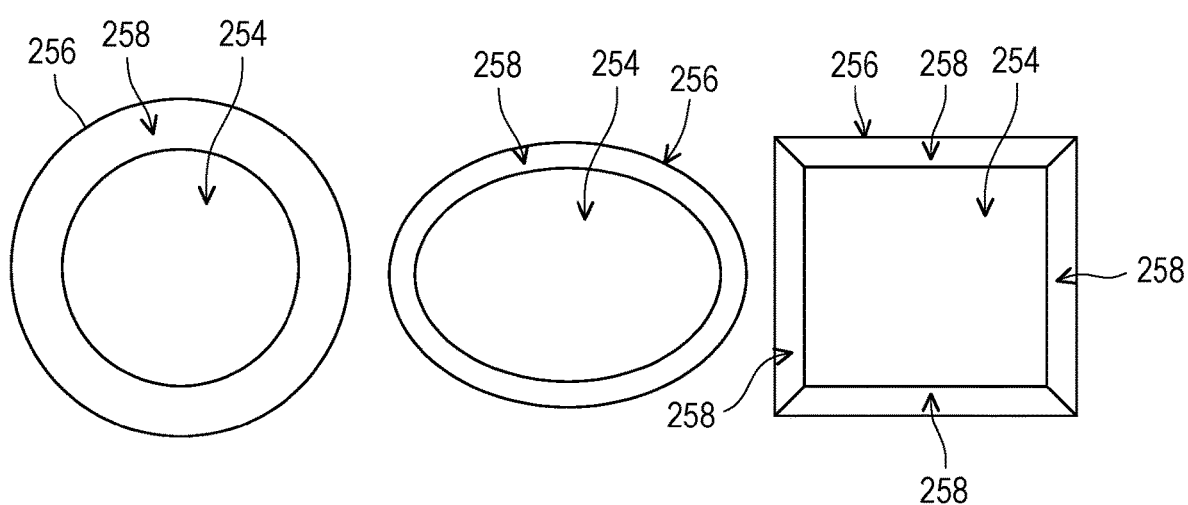
FIG. 4B is a front side view of an end of the pin along one or more clamps of the dis-pellicle tool as shown in FIG. 4A, in accordance with some embodiments.

FIG. 4B are various front side views of various embodiments of the respective pin 222, 224, 226, 228. In the left-most embodiment as shown in FIG. 4B, the first end 254 has a first circular profile, the second end 256 has a second circular profile larger than the first circular profile, and the at least one inclined surface 258 extends from the first end 254 to the second end 256. In the center embodiment as shown in FIG. 4B, the first end has a first oval profile, the second end has a second oval profile larger than the first oval profile, and the at least one inclined surface 258 extends from the first end 254 to the second end 256. In the right-most embodiment as shown in FIG. 4B, the first end 254 has a first rectangular profile, the second end 256 has a second rectangular profile larger than the first rectangular profile, and the at least one inclined surface 258 that extends from the first end 254 to the second end 256. In alternative embodiments, the first and second ends 254, 256 of the respective pin 222, 224, 226, 228 may have a different polygonal profile than as shown in FIG. 4B. For example, the first and second ends 254, 256 may have a triangular profile, an n-gon polygonal profile, or some other similar polygonal or shaped profile.

The first end 254 of the respective pin 222, 224, 226, 228 may have a first width 260 that extends across the first end 254. In some embodiments, the first width 260 may be greater than or equal to 0.2 millimeters (mm). The second end 256 may have a second width 262 that is greater than the first width 260. When the respective pin 222, 224, 226, 228 has a circular or oval profile as discussed earlier herein, the first and second widths 260, 262 may be diameters.

The at least one inclined surface 258 has a slope. In some embodiments, the slope may be greater than or equal to five (5), may be less than or equal to eight (8), or may be some intermediate value between five (5) and eight (8).

When the respective pin 222, 224, 226, 228 is a respective pin of the first group of pins 222, the first reception openings 230 may have a width (e.g., a diameter when the first reception openings 230 are circular or oval shaped) and the width may be larger than the first width 260 of the first end 254. The width of the first reception openings 230 being larger than the first width 260 of the first end 254 allows for the respective pin 222 to be inserted into a corresponding first reception opening 230 of the first reception openings 230. While this discussion is with respect to a respective pin of the first group of pins 222, this discussion may readily apply to the second, third, and fourth groups of pins 224, 226, 228, respectively.

Figure 5A:
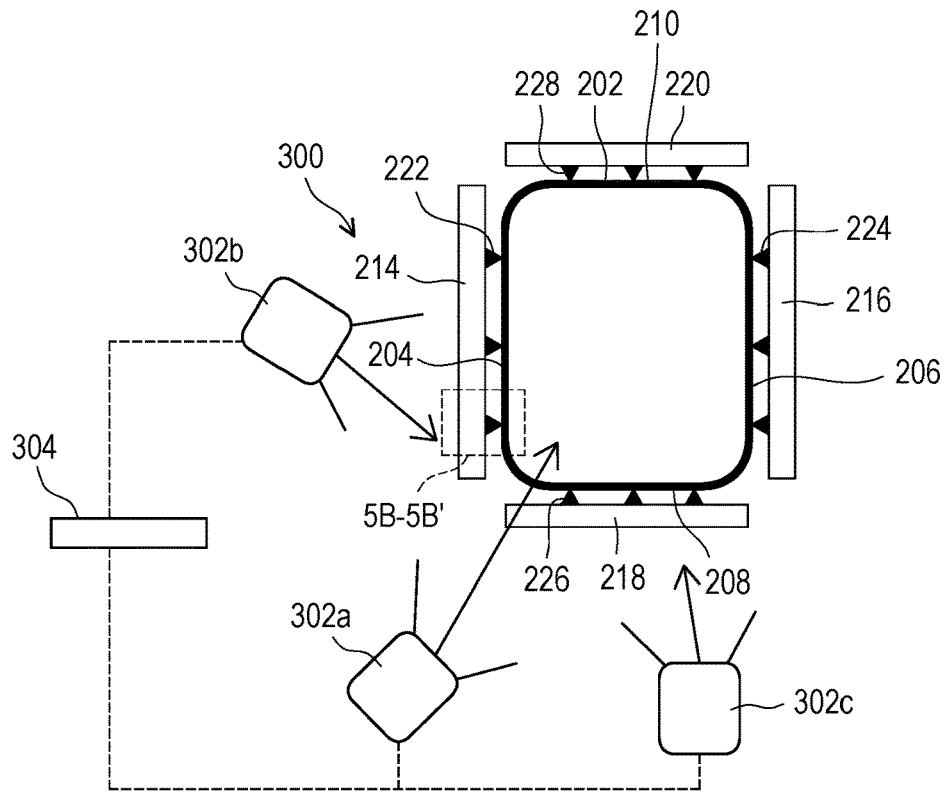
FIG. 5A is a top plan view of a system configured to, in operation, control and position one or more clamps of a dis-pellicle tool, in accordance with some embodiments.

FIG. 5A is a top plan view of a system 300 configured to, in operation, control and position one or more clamps of the dis-pellicle tool or the pellicle removal tool, control and position the stage 244, or control and position both the one or more clamps of the dis-pellicle tool or the pellicle removal tool and the stage 244, respectively. The system 300 includes one or more sensors 302a, 302b, 302c. For example, the one or more sensors 302a, 302b, 302c may be a charge-coupled image capture device that captures images by converting photons to electrons.

A controller 304 is in communication with the one or more sensors 302a, 302b, 302c, respectively. The controller 304 may be in communication with the first, second, third, and fourth clamp structures 214, 216, 218, 220, may be in communication with the stage 244, or may be in communication with both the first, second, third, and fourth clamp structures 214, 216, 218, 220 and the stage 244.

A first sensor 302a of the one or more sensors 302a, 302b, 302c monitors the membrane 114 of the pellicle 200 for the propagation of damage or defects within the membrane 114. For example, if the first sensor 302a begins to detect any propagation of damage or defects within the membrane 114 when removing the pellicle 200 from the photomask 102, the controller 304 may output a control signal to stop movement of the first, second, third, and fourth clamp structures 214, 216, 218, 220, to stop movement of the stage 244, or to stop movement of both the first, second, third and fourth clamp structures 214, 216, 218, 220 and the stage 244 to prevent irreversible damage or defects within the membrane 114 when removing the pellicle 200 from the photomask 102.

A second sensor 302b of the one or more sensors 302a, 302b, 302c may monitor positioning of the first reception openings 230 of the first side portion 204 of the frame 202 relative to the first group of pins 222. For example, if the second sensor 302b of the one or more sensors 302a, 302b, 302c determines that the first reception openings 302b are not aligned (e.g., the first group of guide pins 222 are offset relative to the first reception openings 230) with the first reception openings 230, the controller 304 may output a control signal to move either one of or both of the first clamp structure 214 and the stage 244 to align the first reception openings 230 with the first group of guide pins 222 such that the first group of guide pins 222 may be inserted into the first reception openings 230.

A third sensor 302c of the one or more sensors 302a may monitor positioning of the third reception openings of the third side portion 208 of the frame 202 of the pellicle 200 relative to the third group of guide pins 226. For example, if the third sensor 302c of the one or more sensors 302a, 302b, 302c determines that the third reception openings are not aligned (e.g., the third group of guide pins 226 are offset relative to the third reception openings) with the third reception openings, the controller 304 may output a control signal to move either one of or both of the third clamp structure 218 and the stage 244 to align the third reception openings with the third group of guide pins 226 such that the third group of guide pins 226 may be inserted into the third reception openings of the third side portion 208 of the frame 202 of the pellicle 200.

While not shown, the controller 304 may be in electrical communication with one or more actuators (not shown) that are in mechanical cooperation or engagement with respective ones of the first, second, third, and fourth clamp structures 222, 224, 226, 228 and the stage 244. The controller 304 may send control signals to the one or more actuators (not shown) to control various movements of at least one of the first, second, third, and fourth clamp structures 222, 224, 226, 228, the stage 244, or both the first, second, third, and fourth clamp structures 222, 224, 226, 228 and the stage 244.

While three of the one or more sensors 302a, 302b, 302c are present in the embodiment of the system 300 as shown in FIG. 5A, in some alternative embodiments, there may be more than three of the one or more sensors. For example, there may be five sensors, may be six sensors, or may be some greater number of sensors in alternative embodiments of the system 300. For example, in at least one alternative embodiment, there may be one sensor that monitors the membrane 114 for the onset of the propagation of damage or defects in the membrane 114 and there may be four other sensors for monitoring each of the first, second, third, and fourth clamp structures 214, 216, 218, 220.

Figure 5B:
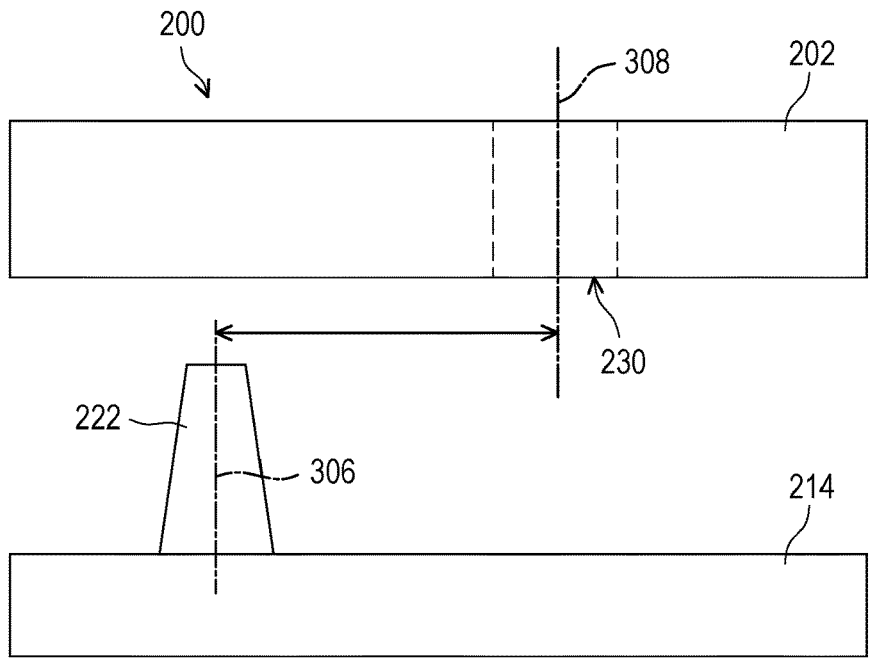
FIG. 5B is a zoomed in and enhanced view of section 5B-5B' as shown in FIG. 5A of at least one pin along a clamp of a dis-pellicle tool and at least one reception opening along a frame of a pellicle, in accordance with some embodiments.

FIG. 5B is a zoomed in and enhanced view of section 5B-5B' of the first clamp structure 214, one of the respective pins 222 of the first group of pins 222, and one of the first reception openings 230 of the first reception openings 230 in the first side portion 204 of the frame 202 of the pellicle 200. As shown in FIG. 5B, when the respective pin 222 is offset relative to the corresponding first reception opening 230, either at least one of or both of the first clamp structure 214 and the stage 244 is moved such that a first centerline 306 of the respective pin 222 is aligned with a second centerline 308 of the corresponding first reception opening 230. Once the first and second centerlines 306, 308 are aligned with each other, the respective pin 222 as shown in FIG. 5B may then be inserted into the first reception opening 230 as shown in FIG. 5B.

Figure 6:
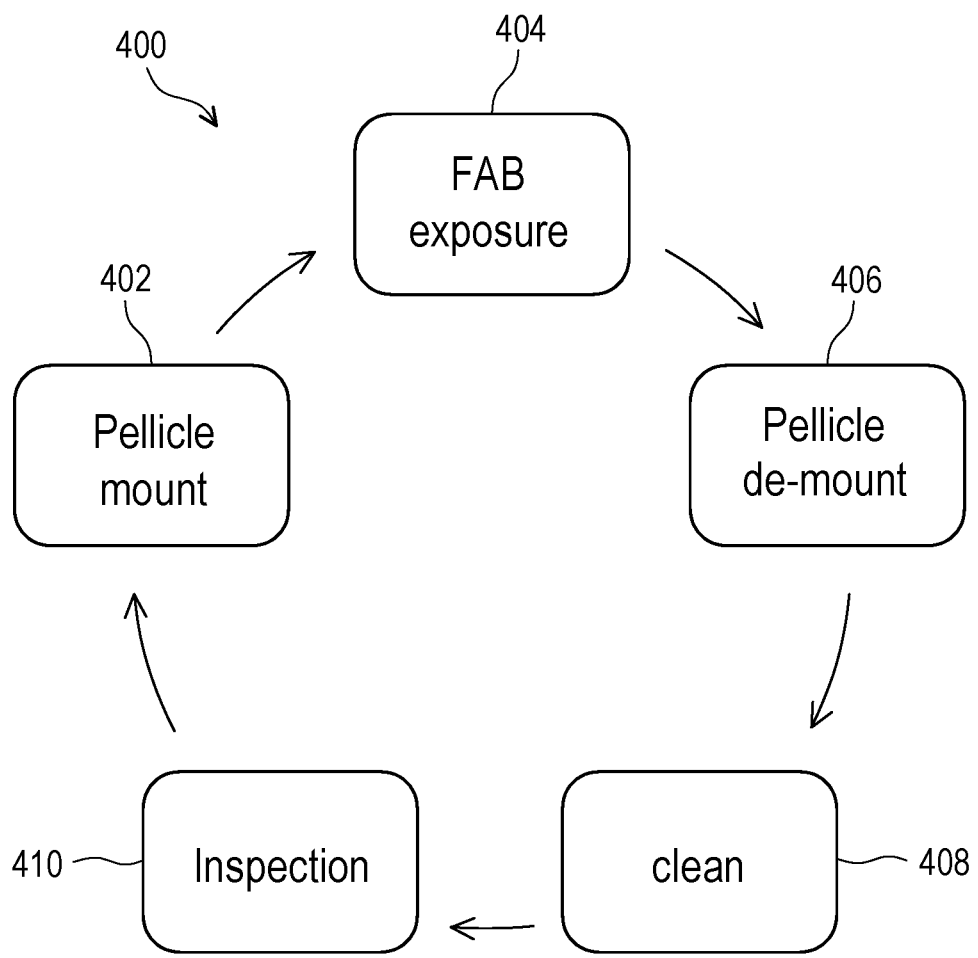
FIG. 6 is a cycle of removing a pellicle from a photomask and reutilizing the pellicle after removal from the photomask, in accordance with some embodiments.

FIG. 6 is directed to a cycle flowchart 400 of the pellicle 200 when being utilized within a semiconductor manufacturing factory (FAB). The cycle flowchart 400 includes a first step 402, a second step 404, a third step 406, a fourth step 408, and a fifth step 410 that are carried out successively and cyclically that the pellicle 200 undergoes multiple times before end of its useful life span.

In a first step 402, the pellicle 200 is mounted, adhered, bonded, or coupled to the photomask 102 by the first adhesive 238, which may readily be seen in FIG. 3B of the present disclosure. After the pellicle 200 is coupled to the photomask by the first adhesive 238, the photomask 102 may be mounted, adhered, bonded, or coupled to the one or more surfaces 250 of the stage 244, which may be within a patterning tool (e.g., an EUV patterning tool or some other type of optical patterning tool that may utilize some other wavelength of light).

After the first step 402 in which the pellicle 200 is coupled to the photomask 102 and the photomask 102 is coupled to the stage 244 within the patterning tool, a second step 404 is performed in which a light source emits light at the membrane 114 and the photomask 102 to pattern a target overlapped and aligned with the membrane 114 and the photomask 102. For example, the target may be a semiconductor substrate, a semiconductor wafer, a semiconductor layer, or some other similar or like type of semiconductor structure or material.

After the second step 404 in which the patterning process has been completed, in a third step 406 the pellicle 200 is removed from the photomask 102 utilizing the first, second, third, and fourth groups of pins 222, 224, 226, 228 as shown in FIGS. 3A and 3B. The details of removing the pellicle 200 in the third step 406 will be discussed in greater detail with respect to FIGS. 7 and 8A-8E as follows herein.

After the third step 406 in which the pellicle 200 is removed from the photomask 102, in a fourth step 408 the pellicle 200 is inspected and cleaned such that contaminants that impede light passing through the membrane 114 are removed from the membrane 114.

After the fourth step 408 in which the membrane 114 of the pellicle 200 is cleaned, in a fifth step 410 the membrane 114 of the pellicle 200 and the photomask are inspected for damage and defects to determine whether the pellicle 200 and the photomask may be reutilized in the patterning process to pattern a new target (e.g., a new semiconductor substrate, a new semiconductor wafer, a new semiconductor layer, or a new semiconductor structure or material) within the patterning tool.

After the fifth step 410 in which the membrane 114 of the pellicle 200 and the photomask 102 are inspected, if both the pellicle 200 and the photomask 102 pass inspection, the respective steps 402, 404, 406, 408, 410 of the cycle flowchart 400 are performed again to reutilize the pellicle 200 and the photomask 102.

Figure 7:
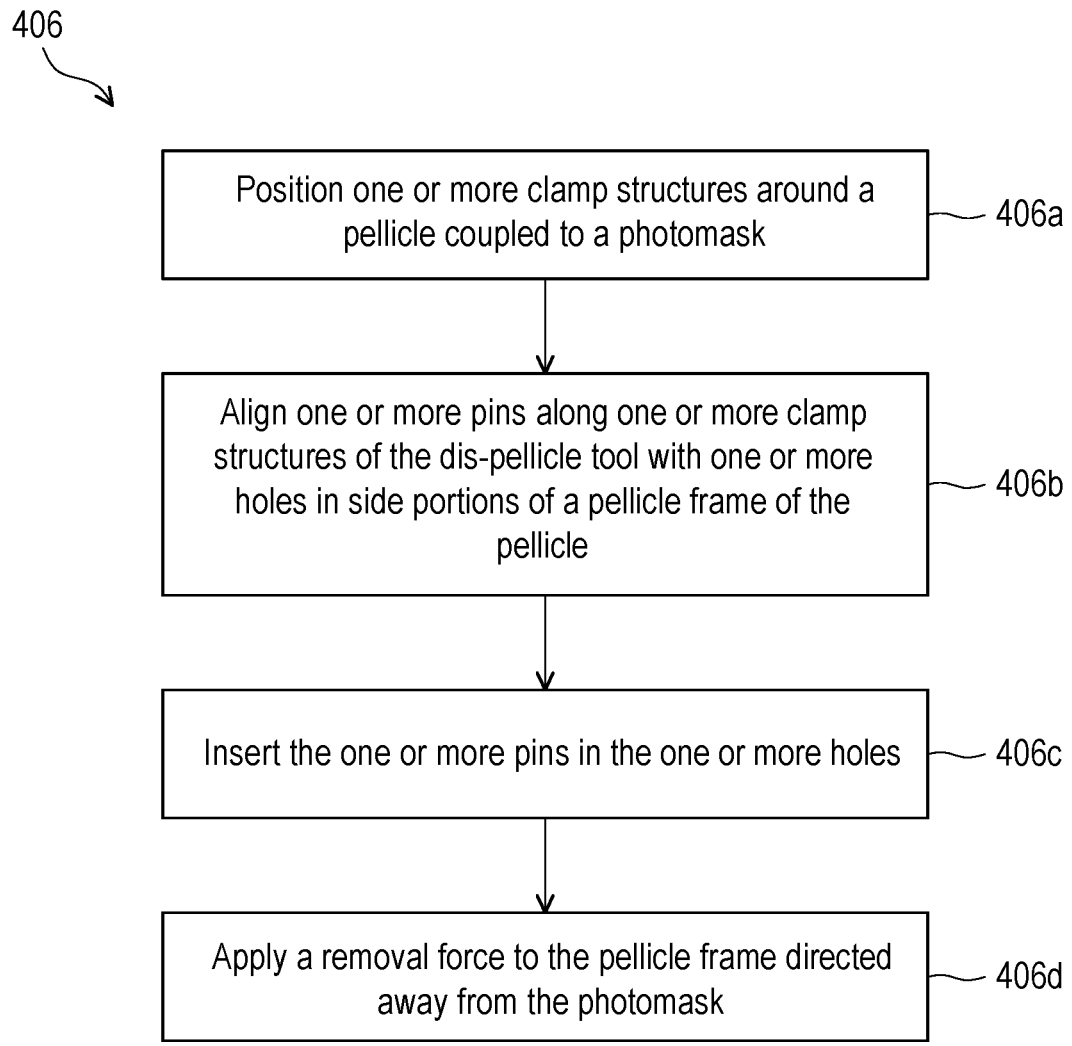
FIG. 7 is a flowchart of a method of removing a pellicle from a photomask to which the pellicle is coupled utilizing one or more clamps with one or more pins, in accordance with some embodiments.

FIG. 7 is a flowchart of additional details with respect to the third step 406 in the cycle flowchart 400. The flowchart includes respective steps 406a, 406b, 406c, 406d.

Figure 8A:
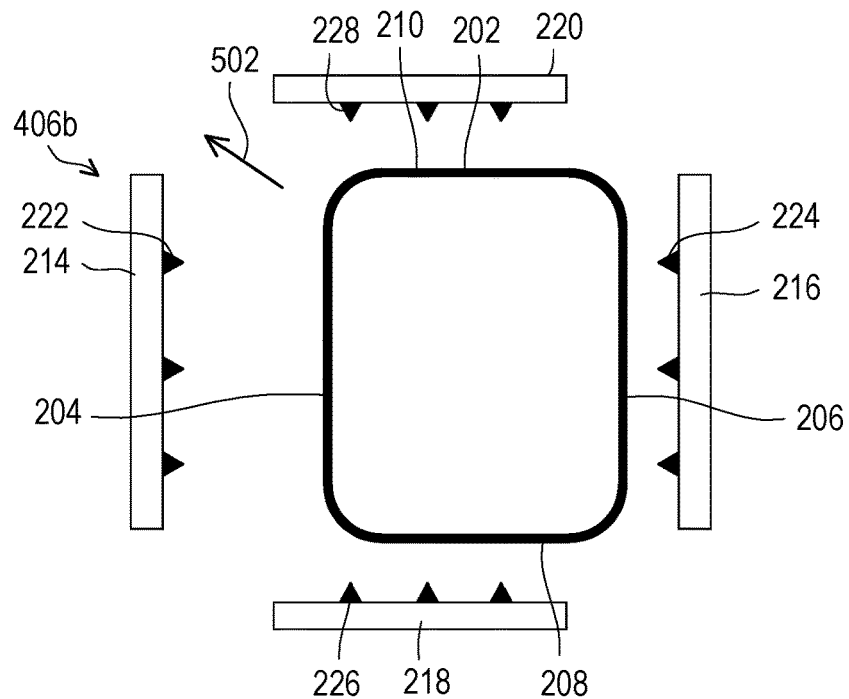
FIGS. 8A-8E are respective views of respective steps of the embodiment of the method of removing the pellicle from the photomask to which the pellicle is coupled as shown in the flowchart of FIG. 7.
Figure 8B:
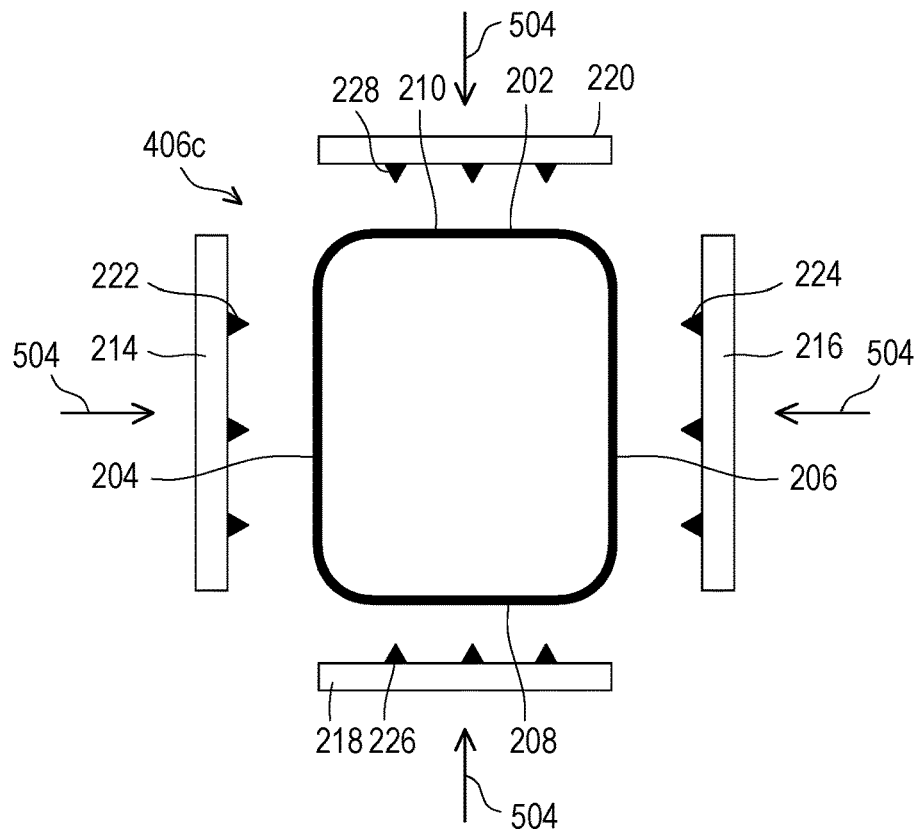
Figure 8C:
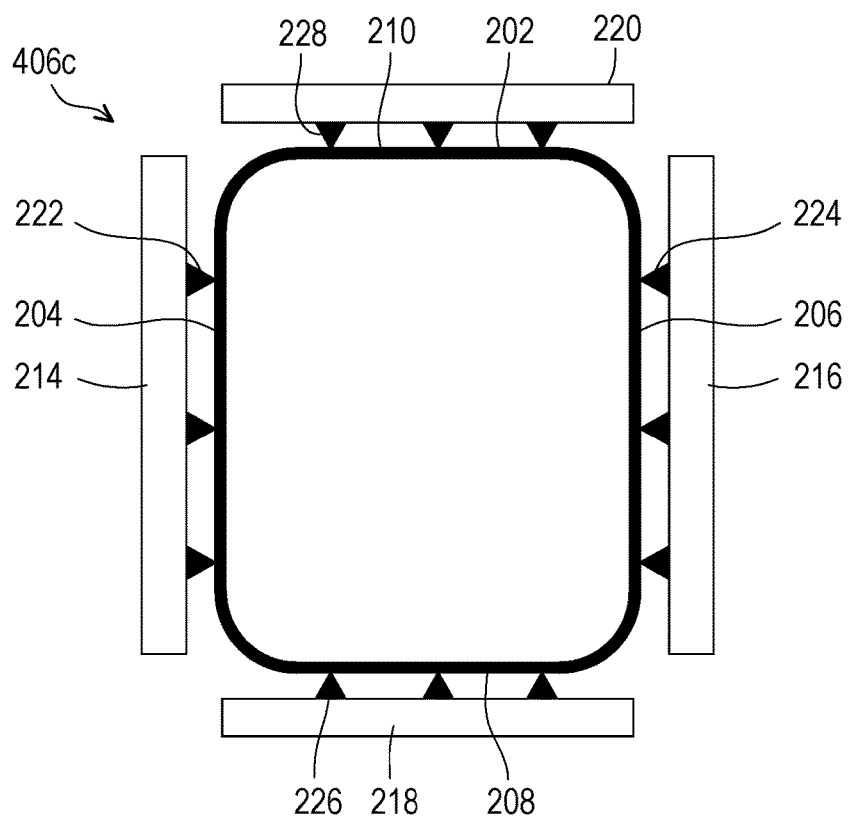
Figure 8D:
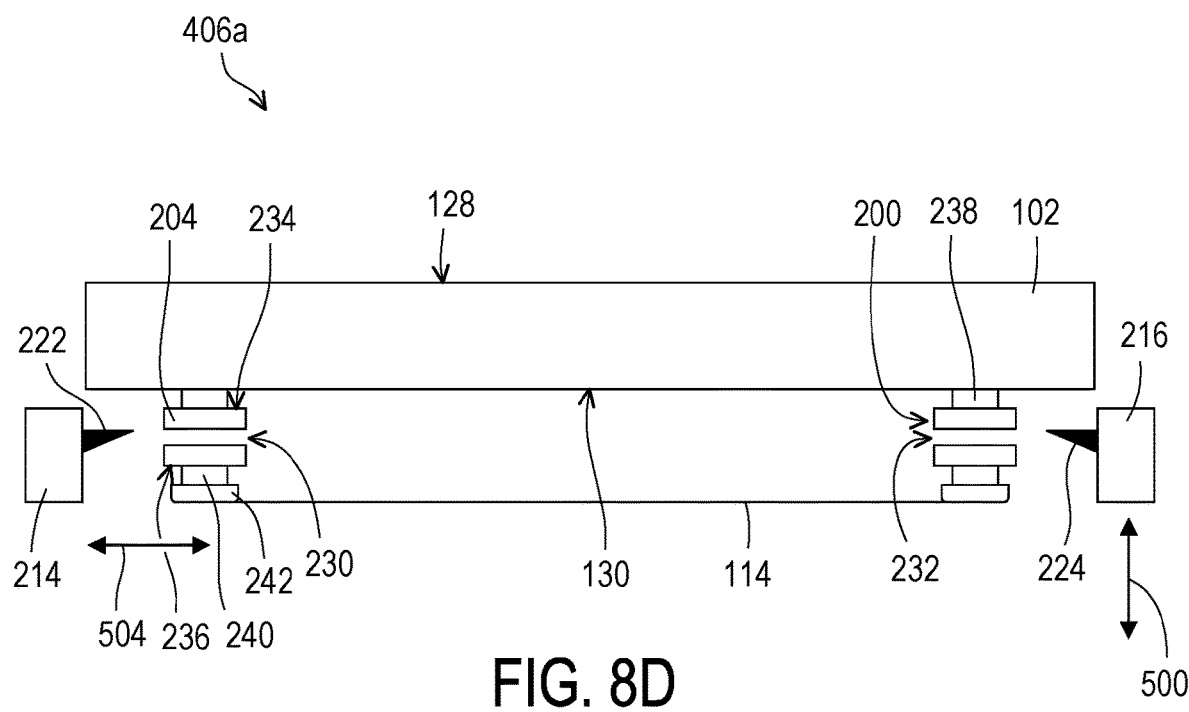

In a first step 406a, the first, second, third, and fourth clamp structures 214, 216, 218, 220 of the dis-pellicle tool or pellicle removal tool are moved into position around the stage 244. The first, second, third, and fourth clamp structures 214, 216, 218, 220 may be positioned around the stage 244 such that each one of the first, second, third, and fourth clamp structures 214, 216, 218, 220 are aligned with a corresponding clamp structure opening 248 within the stage 244 (see FIG. 3D of the present disclosure). For example, in the first step 406a, the first, second, third, and fourth clamp structures 214, 216, 218, 220 may be moved from a lowered position to a raised position in a first direction 500 (see FIG. 8D) by the one or more actuators as discussed earlier herein. Once the first step 406a is performed, the first, second, third, and fourth clamp structures 214, 216, 218, 220 are positioned as shown in FIG. 8A and FIG. 8D such that the first, second, third, and fourth clamp structures 214, 216, 218, 220 are around the pellicle 200 and are level with the pellicle 200.

After the first step 406a in which the first, second, third, and fourth clamp structures 214, 216, 218, 220 are positioned around the pellicle 200 and are raised to be level with the pellicle 200, at least one of the first, second, third, and fourth clamp structures 214, 216, 218, 220 are moved, the stage 244, or both the first, second, third, and fourth clamp structures 214, 216, 218, 220 and the stage 244 are moved such that the respective reception openings in the first, second, third, and fourth side portions 204, 206, 208, 210 are aligned with corresponding ones of the first, second, third, and fourth groups of pins 222, 224, 226, 228 of the first, second, third, and fourth clamp structures 214, 216, 218, 220. As shown in FIG. 8A, the stage 244 is moved in a second direction 502 such that the stage 244 moves the photomask 102 and the pellicle diagonally based on the orientation as shown in FIG. 8A. While the stage 244 is shown as moving in FIG. 8A, in some alternative embodiments, the first, second, third, and fourth clamp structures 214, 216, 218, 220 may be individually moved to align the respective reception openings in the first, second, third, and fourth side portions 204, 206, 208, 210 with the first, second, third, and fourth groups of pins 222, 224, 226, 228. While the stage 244 is shown as moving in FIG. 8A, in some alternative embodiments, both the stage 244 may be moved and the first, second, third, and fourth side portions 204, 206, 208, 210 may be individually moved and adjusted or moved and adjusted together to align the respective reception openings in the first, second, third, and fourth side portions 204, 206, 208, 210 with the first, second, third, and fourth groups of pins 222, 224, 226, 228 of the first, second, third and fourth clamp structures 214, 216, 218, 220.

After the second step 406*b* in which the respective reception openings in the first, second, third, and fourth side portions 204, 206, 208, 210 are aligned with the first, second, third, and fourth groups of pins 222, 224, 226, 228, in a third step 406*c* the first, second, third, and fourth clamp structures 214, 216, 218, 220 are moved inward toward the frame 202 of the pellicle 200 to insert the first, second, third, and fourth groups of pins 222, 224, 226, 228 of the first, second, third, and fourth clamp structures 214, 216, 218, 220 into the respective reception openings in the first, second, third, and fourth side portions 204, 206, 208, 210 of the frame 202. This inward movement to insert the respective pins into the reception openings is represented by arrows 504 as shown in FIG. 8B. The first, second, third, and fourth groups of pins 222, 224, 226, 228 being inserted into the respective reception openings of the first, second, third, and fourth side portions 204, 206, 208, 210, respectively, may readily be seen in FIG. 8C and FIG. 8E.

Figure 8E:
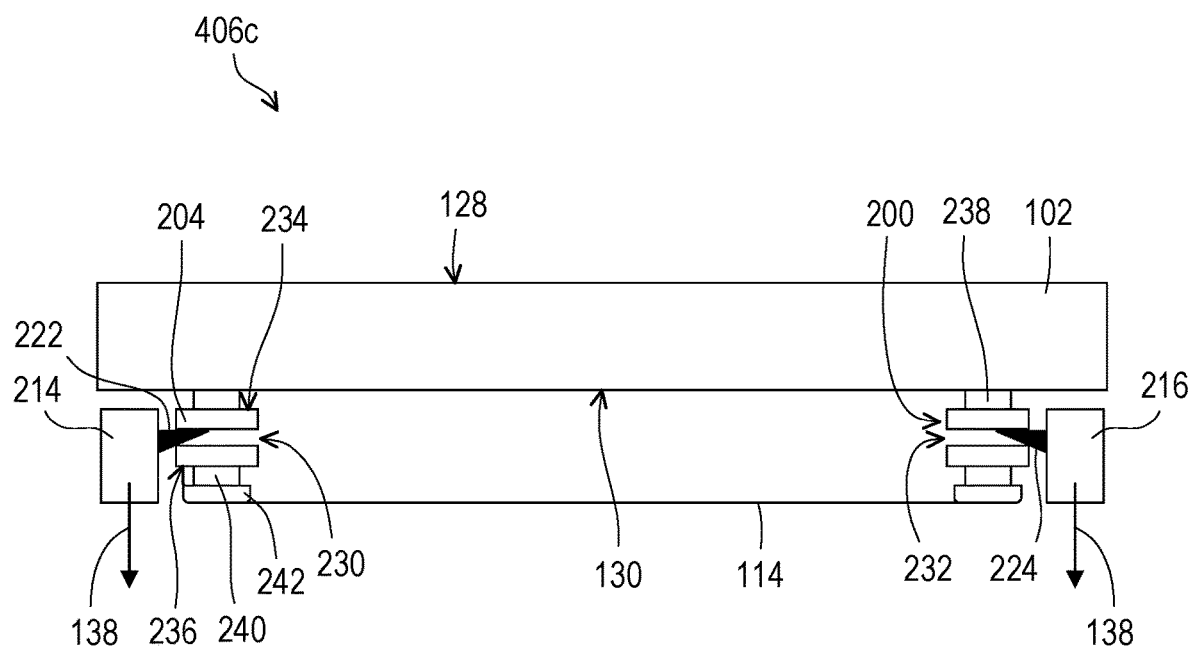

After the third step 406*c* in which the first, second, third, and fourth groups of pins 222, 224, 226, 228 have been inserted into the respective reception openings of the first, second, third, and fourth side portions 204, 206, 208, 210 of the frame 202 of the pellicle 200, in a fourth step 406*d* the removal force 138 is applied to the frame 202 by moving the first, second, third, and fourth clamp structures 214, 216, 218, 220 away from the photomask 102, which is directed in the downward direction based on the orientation as shown in FIG. 8E. As the first, second, third, and fourth clamp structures 214, 216, 218, 220 move away from the photomask the first, second, third, and fourth groups of pins 222, 224, 226, 228 pull downward on the frame 202 such that the first adhesive 238 is broken removing the pellicle 200 from the photomask 102. After the pellicle 200 is removed from the photomask 102, the other steps of the cycle flowchart 400 may be performed. The process as described with respect to the flowchart 500 may be performed over and over again as the cycle flowchart 400 is performed over and over again.

While not discussed in detail herein, the respective reception openings of the first, second, third, and fourth side portions 204, 206, 208, 210 of the frame 202 of the pellicle 200 may be configured to, in operation, allow for venting of fluid between the membrane 114 and the photomask 102 when performing a patterning process on a semiconductor wafer, a semiconductor substrate, a semiconductor layer, or some other similar or like type of semiconductor material.

As is readily apparent in view of the above discussion herein, the present disclosure provides one or more embodiments of a dis-pellicle tool or pellicle removal tool including one or more clamp structures that are utilized to apply a removal force to a pellicle frame of a pellicle in order to remove the pellicle from a photomask. When the force is applied by the one or more clamp structures to the pellicle frame, the force is applied in a balanced manner across the pellicle frame such that the force is evenly distributed across and along the pellicle frame. This even distribution of the removal force prevents or reduces the likelihood of damage to the pellicle or the membrane of the pellicle when being removed from a photomask. For example, this even distribution of the removal force to the pellicle frame may prevent or reduce the likelihood of wrinkling, rupturing, cracking, or other similar defects within a membrane of the pellicle reducing manufacturing costs, reducing waste costs, and preventing or reducing contamination or damage to the photomask to which the pellicle was previously coupled.

Preventing or reducing the likelihood of damage or defects propagating within a membrane of a pellicle reduces manufacturing costs, wastes costs, and increases the usable life span of the pellicle. The increased life span of the pellicle reduces replacement costs as the pellicle may be utilized several more times before needing to be replaced due to damage or defects propagating within the membrane of the pellicle.

At least one embodiment of a pellicle frame of the present disclosure may be summarized as including: a frame including: a first surface; a second surface opposite to the first surface; a first side portion; a second side portion opposite to the first side portion; a third side portion transverse to the first and second side portions, the third side portion extends from the first side portion to the second side portion and is coupled to the first side portion and the second side portion; a fourth side portion transverse to the first and second side portions, the fourth side portion extends from the first side portion to the second side portion and is coupled to the first side portion and the second side portion, and the fourth side portion is opposite to the third side portion; an opening delimited by the first, second, third, and fourth side portions; a first group of holes in the first side portion; a second group of holes in the second side portion; a third group of holes in the third side portion; and a fourth group of holes in the fourth side portion.

At least one embodiment a method of the present disclosure may be summarized as including: monitoring a first clamp structure with a first group of pins, a second clamp structure with a second group of pins, a third clamp structure with a third group of pins, and a fourth clamp structure with a fourth group of pins with a plurality of image sensors; aligning the first group of pins of the first clamp structure with a first group of holes in a first side portion of a pellicle frame of a pellicle; aligning the second group of pins of the second clamp structure with a second group of holes in a second side portion of the pellicle frame opposite to the first side portion; aligning the third group of pins of the third clamp structure with a third group of holes in a third side portion of the pellicle frame transverse to the first and second side portions; aligning the fourth group of pins of the fourth clamp structure with a fourth group of holes in a fourth side portion of the pellicle frame opposite to the third side portion and transverse to the first and second side portions; inserting the first, second, third, and fourth group of pins in the first, second, third, and fourth groups of holes, respectively; and applying a force to the pellicle frame through the first, second, third, and fourth groups of pins in the first, second, third, and fourth groups of holes, respectively, by moving the first, second, third, and fourth clamp structures away from a photomask coupled to the pellicle frame while maintaining the photomask in a stationary position.

At least one embodiment of a dis-pellicle tool may be summarized as including: a pellicle clamp structure configured to, in operation, clamp onto a pellicle frame of a respective pellicle coupled to a photomask, the pellicle clamp structure including: a body portion; one or more tapered pins that protrudes from the body portion, the one or more tapered pins includes: a first end; a second end opposite to the first end; and at least one inclined sidewall that is transverse to the first end and the second end, the at least one inclined sidewall extends from the first end to the second end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle frame, comprising:
    a frame including:
        a first surface;
        a second surface opposite to the first surface;
        a first side portion;
        a second side portion opposite to the first side portion;
        a third side portion transverse to the first and second side portions, the third side portion extends from the first side portion to the second side portion and is coupled to the first side portion and the second side portion;
        a fourth side portion transverse to the first and second side portions, the fourth side portion extends from the first side portion to the second side portion and is coupled to the first side portion and the second side portion, and the fourth side portion is opposite to the third side portion;
        an opening delimited by the first, second, third, and fourth side portions;
        a group of first holes in the first side portion, the group of first holes includes a first number, and the group of first holes are empty;
        a group of second holes in the second side portion, the group of second holes includes a second number, and the group of second holes are empty;
        a group of third holes in the third side portion, the group of third holes includes a third number, and the group of third holes are empty; and
        a group of fourth holes in the fourth side portion, the group of fourth holes includes a fourth number, and the group of fourth holes are empty, and
        wherein the first number, the second number, the third number, and the fourth number are equal to each other, and wherein the group of first holes, the group of second holes, the group of third holes, and the group of fourth holes are configured to, in operation, receive corresponding tapered pins of a plurality of clamping structures.

2. The pellicle frame of claim 1, wherein the groups of the first, second, third, and fourth holes are configured to, in operation, receive corresponding groups of pins of one or more corresponding clamps.

3. The pellicle frame of claim 1, wherein the first number, the second number, the third number, and the fourth number are greater than or equal to 2.

4. The pellicle frame of claim 1, wherein the first number, the second number, the third number, and the fourth number are equal to each other.

5. The pellicle frame of claim 1, wherein respective adjacent holes of the respective groups of first holes, second holes, third holes, and fourth holes are spaced equidistant from each other.

6. The pellicle frame of claim 5, wherein the respective adjacent holes of the respective groups of first, second, third, and fourth holes are spaced apart from each other to avoid rupturing of a membrane coupled to the frame when the pellicle frame is being removed from a respective photomask by a dis-pellicle tool.

7. The pellicle frame of claim 6, wherein the respective adjacent holes of the first, second, third, and fourth groups of holes are spaced apart from each other by a length determined by a formula as follows:

$$L = 6.498 * \text{sqrt}(1/\mu)$$

wherein L is length and $\mu$ is an adhesion force of an adhesive coupling the frame of the pellicle to the respective photomask.

8. A method, comprising:
    monitoring a first clamp structure with a first group of pins, a second clamp structure with a second group of pins, a third clamp structure with a third group of pins, and a fourth clamp structure with a fourth group of pins with a plurality of image sensors;
    aligning the first group of pins of the first clamp structure with a first group of holes in a first side portion of a pellicle frame of a pellicle;
    aligning the second group of pins of the second clamp structure with a second group of holes in a second side portion of the pellicle frame opposite to the first side portion;
    aligning the third group of pins of the third clamp structure with a third group of holes in a third side portion of the pellicle frame transverse to the first and second side portions;
    aligning the fourth group of pins of the fourth clamp structure with a fourth group of holes in a fourth side portion of the pellicle frame opposite to the third side portion and transverse to the first and second side portions;
    inserting the first, second, third, and fourth group of pins in the first, second, third, and fourth groups of holes, respectively; and
    applying a force to the pellicle frame through the first, second, third, and fourth groups of pins in the first, second, third, and fourth groups of holes, respectively, by moving the first, second, third, and fourth clamp structures away from a photomask coupled to the pellicle frame while maintaining the photomask in a stationary position.

9. The method of claim 8, wherein applying the force to the pellicle frame further includes overcoming an adhesion force of an adhesive coupling the pellicle frame to the photomask.

10. The method of claim 9, further comprising, after removing the pellicle frame from the photomask, cleaning a membrane of the pellicle coupled to the pellicle frame of the pellicle.

11. The method of claim 10, further comprising, after cleaning the membrane of the pellicle, coupling the pellicle frame to at least one of the following of the photomask or another photomask.

12. The method of claim 11, wherein inserting the first, second, third, and fourth groups of pins into the first, second, third, and fourth groups of holes, respectively, occurs simultaneously after each of the first, second, third, and fourth groups of pins are aligned with the first, second, third, and fourth groups of holes, respectively.

13. The method of claim 11, wherein aligning the first, second, third, and fourth groups of pins with the first, second, third, and fourth groups of holes further includes:
moving a stage structure that supports the photomask.

14. The method of claim 11, wherein aligning the first, second, third, and fourth groups of pins with the first, second, third, and fourth groups of holes further includes:
moving at least one of the first, second, third, and fourth clamp structures.

15. A dis-pellicle tool, comprising:
a first pellicle clamp structure configured to, in operation, engage with a first portion of a pellicle frame of a respective pellicle coupled to a photomask, the first pellicle clamp structure including:
a first body portion;
one or more first tapered pins that protrude from the first body portion, the one or more first tapered pins are configured to, in operation, be inserted into one or more first holes along a first side portion of the pellicle frame, each respective first tapered pin of the one or more first tapered pins includes:
a first end;
a second end opposite to the first end; and
at least one first inclined sidewall that is transverse to the first end and the second end, the at least one first inclined sidewall extends from the first end to the second end;
a second pellicle clamp structure configured to, in operation, engage with a second portion of the pellicle frame of the respective pellicle coupled to the photomask, the second portion of the pellicle frame being opposite to the first portion of the pellicle frame, the second pellicle clamp structure including:
a second body portion;
one or more second tapered pins that protrude from the second body portion, the one or more second tapered pins are configured to, in operation, be inserted into one or more second holes along a second side portion of the pellicle frame opposite to the first side portion of the pellicle frame, each respective second tapered pine of the one or more second tapered pins including:
a third end;
a fourth end opposite to the third end; and
at least one second inclined sidewall transfer to the third end and the fourth end, the at least one second inclined sidewall extends from the third end to the fourth end.

16. The dis-pellicle tool of claim 15, further comprising:
a third pellicle clamp structure transverse to the first and second pellicle clamp structures, the third pellicle clamp structure is configured to, in operation, engage with a third portion of the pellicle frame of the respective pellicle coupled to the photomask, the third portion of the pellicle frame being transverse to the first portion of the pellicle frame and transverse to the second portion of the pellicle frame, and the third portion of the pellicle frame extends from the first portion of the pellicle frame to the second portion of the pellicle frame; and
a fourth pellicle clamp structure opposite to the third pellicle clamp structure and transverse to the first and second pellicle clamp structures, the fourth pellicle clamp structure is configured to, in operation, engage with a fourth portion of the pellicle frame of the respective pellicle coupled to the photomask, the fourth portion of the pellicle frame being transverse to the first portion of the pellicle frame and transverse to the second portion of the pellicle frame, the fourth portion of the pellicle frame being opposite to the third portion of the pellicle frame, and the fourth portion of the pellicle frame extends from the first portion of the pellicle frame to the second portion of the pellicle frame.

17. The dis-pellicle tool of claim 16, wherein the first, second, third, and fourth pellicle clamp structures are movable in a direction laterally inwards and outwards relative to a central region defined by the first, second, third, and fourth pellicle clamp structures.

18. The dis-pellicle tool of claim 16, wherein the first pellicle clamp structure, the second pellicle clamp structure, the third pellicle clamp structure, and the fourth pellicle clamp structure are configured to, in operation, be individually movable relative to each other and relative to the pellicle frame.

19. The dis-pellicle tool of claim 15, wherein:
the first end has a first end surface with a first surface area; and
the second end has a second end surface with a second surface area greater than the first surface area.

20. The dis-pellicle tool of claim 15, wherein the first pellicle clamp structure, and the second pellicle clamp structure are configured to, in operation, be individually movable relative to each other and relative to the pellicle frame.

* * * * *